Jan. 5, 1965 H. BENDA 3,164,500

METHOD OF PRODUCING AN ELECTRONIC SEMI-CONDUCTOR DEVICE

Filed May 10, 1961

3,164,500
METHOD OF PRODUCING AN ELECTRONIC SEMICONDUCTOR DEVICE

Hansjochen Benda, Erlangen, Germany, assignor to Siemens-Schuckertwerke Aktiengesellschaft, Berlin, Siemensstadt, Germany, a corporation of Germany Filed May 10, 1961, Ser. No. 109,192
Claims priority, application Germany, May 13, 1960, S 68,499
7 Claims. (Cl. 148—186)

My invention relates to a method of producing rectifiers, transistors and other electronic semiconductor devices.

According to a known method, a surface layer of silicon or other semiconductor substance having a given conductance type (n-type or p-type) is doped to assume the opposite conductance type. Thereafter, the reversely doped surface layer is subdivided into separate zones by etching a groove into the semiconductor surface. By again reversely doping a portion of a zone thus produced, a four-layer semiconducting device can be obtained, for example.

In semiconductor devices as heretofore made according to this method, the etched groove has a considerable depth so that the mechanical strength of the device is greatly impaired. Furthermore, any subsequent treatment of the dividing groove by etching or other surface processing is difficult to perform and difficult to test.

It is an object of my invention to avoid such shortcomings.

To this end, and in accordance with my invention, I first proceed in principle, in analogy to the above-mentioned known method. That is, I provide a semiconductor disc, wafer or other body of essentially monocrystalline material, preferably silicon, and introduce into the surface layer of a given depth a doping substance of a given doping concentration in order to develop in the surface layer a conductance of the type opposed to the conductance type of the original semiconductor material. Thereafter, I divide this reversely doped surface layer into a plurality of zones by etching a groove into the semiconductor body. However, according to an essential feature of my invention, I keep the reversely doped surface layer of the semiconductor thinner than ultimately required and dope the layer to a higher doping concentration than ultimately required. When thereafter the groove is etched into the semiconductor body, I subject the body to heat treatment for diffusing the doping material from the strongly doped surface layer into the interior of the semiconductor body. As a result, the doped and mutually separated surface zones of the body are widened in depth and reduced in dope concentration. This affords keeping the etched groove considerably shallower than heretofore necessary because the ultimate thickness of the doped surface zones is produced by diffusion only after the groove has been etched into the surface.

Figure 1:
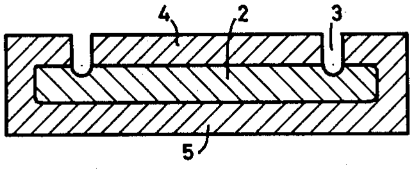

The invention will be further described with reference to an embodiment of the invention illustrated by way of example on the accompanying drawing in which FIG. 1 illustrates a cross section of a semiconductor device produced in accordance with the above-mentioned known method, and FIGS. 2, 3, 4 and 5 illustrate a semiconductor device made by the method according to the invention, the different illustrations representing respectively different stages of the production method.

A semiconductor member according to FIG. 1 can be produced in the following manner. A circular semiconductor disc, for example, of silicon, having a given type of conductance, is contacted with a reversely doping substance which is caused to diffuse into the semiconductor body by heat treatment. Upon lapse of a given processing time, the required depth of penetration is attained, and the diffusion process is terminated. Thereafter, the surface layer, reversely doped by diffusion of donor or acceptor atoms, is subdivided into two zones 4 and 5 by etching a circular concentric groove 3 into the body. After this is done, the core portion 2 of the semiconductor body, maintaining its original type of conductance, carries two reversely doped zones 4 and 5 separated by the groove 3. It is apparent from the illustration that the etched groove 3 mechanically weakens the semiconductor member because the depth of the groove extends almost down to one-half of the disc thickness in order to separate the zones 4 and 5 from each other.

The semiconductor device illustrated in FIG. 5 in its ultimate form is produced as follows.

Figure 2:
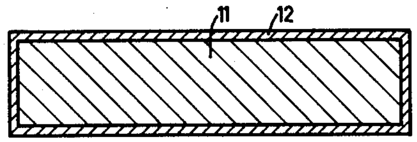

Shown in FIG. 2 is a circular semiconductor disc 11 consisting, for example, of high-ohmic $$(\text{rho}=100\ \text{ohm}\cdot\text{cm.})x$$

n-type silicon into whose surface an acceptor substance, for example, aluminum, was introduced by diffusion. This can be done, for example, by placing the semiconductor disc, preferably together with a number of other semiconductor discs, in a quartz vessel and also locating an amount of aluminum in the vessel. After sealing and evacuating the vessel, it is heated together with its contents up to a temperature of 1220 to 1240° C. This temperature is maintained for a period of thirty minutes, for example. After such processing, a thin surface layer 12 of the silicon disc 11 is strongly doped with aluminum, whereas the core 11 retains its original n-type conductance.

Thereafter, the semiconductor disc is coated with a varnish, for example, Pizein. At the location where subsequently the groove 13 is to be etched, the coating is removed. In this manner, any desired course of the groove can readily be obtained. In the present case, the desired groove is to have circular shape. When now the semiconductor disc is immersed in an etching solution, then only the surface of the semiconductor not covered by the protective varnish is attacked, so that the desired groove is etched into the disc. For silicon, a suitable etching solution was found to consist of one part by weight of fuming nitric acid, two parts distilled fluoric acid, and one part acetic acid. The semiconductor disc, coated with Pizein, with the exception of the area to be etched, is immersed into such an etching solution and is kept therein for about 0.5 minute. Thereafter, the disc is rinsed with water and the Pizein coating is removed. This can be done by dissolving it in toluol.

Figure 3:
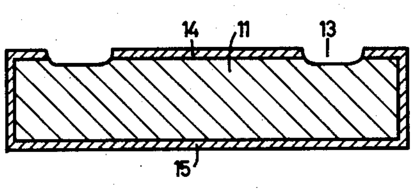

The semiconductor disc may have a thickness of about 250 microns, for example. After diffusing aluminum into the silicon in the above-described manner, a surface layer of about 10 microns thickness is doped with aluminum. After the above-described etching is performed, a groove of about 50 microns depth and 0.5 to 1 mm. width is etched into the body, dividing the surface layer into two zones. FIG. 3 shows the result: The groove 13 separates the two p-type zones 14 and 15 from each other, both carried on the core 11 which retained its n-type conductance.

Figure 4:
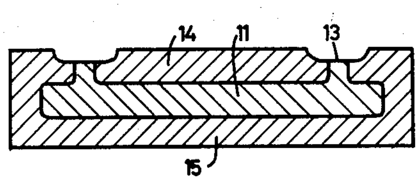

Thereafter, the disc according to FIG. 3 is subjected to heating in order to cause the doping material contained in the two zones 14 and 15, in the above-described example the aluminum, to further diffuse into the interior of the silicon core. This heat treatment is continued until the desired thickness and dope concentration of zones 14 and 15 is attained. In the example described above, the disc according to FIG. 3 is heated in vacuum to about 1220° C. for approximately twenty-four hours. This results in a modified semiconductor body, as shown in FIG. 4. The p-type zones 14 and 15 now have a thickness of about 80 microns. With a sufficient original width of the shallow groove 13, the zones 14 and 15 remain separated from each other by n-type material. The few aluminum atoms that may have newly diffused into the surface of the groove 13 are eliminated by the subsequent etching usually required for other reasons, such as purification of the surface. The second diffusion may also be carried out at lower temperatures, for example, 1100° C. by extending the necessary heat treatment a correspondingly prolonged period of time.

Generally, the temperature range for the first and second diffusion treatments of silicon is from about 1100° C. to about 1260° C., and the treating time for the first diffusion treatment is from about 15 to 60 minutes for n-type silicon but up to about 150 minutes for p-type silicon, whereas the second diffusion treatment requires a heating period of about one or more days, the longer period relating to the lower temperatures of the stated ranges.

Figure 5:
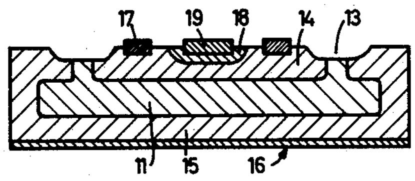

FIG. 5 illustrates a four-layer semiconductor device such as a silicon-controlled rectifier, as may be produced for example from the semiconductor member shown in FIG. 4. The zone 15 is intimately joined over a large area with a metallic electrode 16. The electrode may be produced by alloying a gold-boron foil (0.03% B, remainder Au) onto the silicon body. The zone 14 is contacted by an annular electrode 17 which can be produced in the same manner. By alloying a smaller circular disc of gold-antimony foil (0.5% Sb, remainder Au) a portion of the p-conducting zone 14 is reversely doped to assume n-type conductance and thus forms another zone 18 which is contacted by an electrode 19.

It is preferable to perform all above-mentioned alloying steps in a single heating operation. The foils may have a thickness of 30 microns, for example, and the alloying operations can all be performed at about 700° C. In any event, the alloying temperature should be above the eutectic temperature of gold and silicon (about 370° C.).

The method according to the invention is analogously applicable to a variety of other semiconductor devices. Thus, for example, the starting material may have p-type conductance and a reversing doping to n-type conductance in a surface layer may be performed, for example, with the aid of phosphorus. The semiconductor body may also consist of germanium. The method of the invention is further applicable to the production of semiconductor devices other than four-layer devices, for example transistors, photo-elements, and the like.

Another modification of the above-described method according to my invention resides in the following. The first, relatively intensive, doping can be carried out subsequent to an alloying method. For example, a boron-containing gold foil as described above is placed upon the flat side of the semiconductor disc and is alloyed together with the disc by a heat-processing. Thereafter, the gold-semiconductor eutectic, which was produced at the surface of the semiconductor body, is eliminated with the aid of aqua regia. This exposes the recrystallization layer which now contains boron atoms embedded in the recrystallized silicon or other semiconductor material. This recrystallization layer can then be subdivided by etching a groove in the above-described manner. If desired, more than one groove may be etched in order to subdivide the surface layer into more than two zones. Thereafter, another heat treatment is applied, also as described above, for diffusing the boron into the interior of the semiconductor material.

Such and other modifications will be obvious to those skilled in the art, upon studying this disclosure, and require no departure from the essential features of my invention as set forth in the annexed claims.

I claim:

1. The method of producing an electric semiconductor device having a crystalline semiconductor body with regions of respectively different conductance type, which comprises the steps of doping a surface layer of a semiconductor body having a given conductance type with a conductance-type reversing dope substance, said doping being effected down to a depth smaller than ultimately required and with a dope concentration higher than ultimately required; then etching into the reversely doped surface layer a groove of sufficient depth to divide the doped layer into a plurality of separate doped zones, the etching depth being smaller than said ultimate doped zone depth; and thereafter heating the body to diffusion temperature a sufficient length of time to diffuse the doping substance down to said required depth beyond the depth of said groove, said groove being sufficiently wide to maintain zone separation after diffusion.

2. The method of producing an electric semiconductor device having a crystalline semiconductor body with regions of respectively different conductance type, which comprises the steps of contacting a semiconductor body of a given conductance type with conductance-type reversing dope substance and heating the contacted body to diffusion temperature for a period of time sufficient to produce in said body a reversely doped surface layer of smaller thickness and higher dope concentration than ultimately required; then etching into the reversely doped layer a groove and thereby dividing the layer into separate zones, the etched groove being given a depth smaller than said ultimate doped layer depth and a width sufficient to maintain zone separation in the ultimate device; and thereafter again heating the body to diffusion temperature but for a time longer than said period so as to diffuse the dope substance down to said ultimate depth and ultimate concentration.

3. The method of producing an electric semiconductor device having a substantially monocrystalline body of n-type silicon, heating said body in the presence of aluminum to a temperature of about 1240° C. for a period of about 30 minutes whereby a p-type surface layer is produced in the silicon body; etching a groove into the surface layer to divide it into separate p-type zones; then heating the body to a temperature of about 1220° C. for a period of about 24 hours, thereby increasing the depth of the p-type zones beyond the depth of the groove.

4. The method of producing an electric semiconductor device having a substantially monocrystalline body of p-type silicon, heating said body in the presence of phosphorus at a pressure of about $10^{-2}$ mm. Hg to a temperature of about 1240° C. for a period of about 150 minutes whereby an n-type surface layer is produced in the silicon body; etching a groove into the surface layer to divide it into separate n-type zones; then heating the body to a temperature of about 1220° C. for a period of about 5 days, thereby increasing the depth of the n-type zones beyond the depth of the groove.

5. The method of producing an electric semiconductor device having a crystalline semiconductor body with regions of respectively different conductance type, which comprises the steps of placing a surface of the body in face-to-face contact with a material containing conductance-type reversing dope substance, heating the semiconductor body and the material, cooling the semiconductor body and the material whereby a reversely doped recrystallization layer is formed in the semiconductor body and a eutectic layer is formed at the surface of the semiconductor body; eliminating the eutectic layer from the semiconductor body down to the recrystallization layer; then etching a groove into the recrystallization layer to thereby divide the layer into separate zones; thereafter heating the etched body to diffusion temperature a sufficient time to diffuse dope substance from said zones down to a depth beyond that of the groove.

6. The method of producing an electric semiconductor device having a crystalline silicon semiconductor body with regions of respectively different conductance type, which comprises the steps of doping a surface layer of a semiconductor body having a given conductance type with a conductance-type reversing dope substance, said doping being effected down to a depth smaller than ultimately required and with a dope concentration higher than ultimately required; then etching into the reversely doped surface layer a groove of sufficient depth to divide the doped layer into a plurality of separate zones, the etching depth being smaller than said ultimate doped zone depth; and thereafter heating the body to diffusion temperature from about 1100° C. to about 1240° C. for a minimum of about one day to diffuse the doping substance down to said required depth beyond the depth of said groove, said groove being sufficiently wide to maintain zone separation after diffusion.

7. The method of producing an electric semiconductor device having a crystalline semiconductor silicon body with regions of respectively different conductance type, which comprises the steps of contacting a semiconductor body of a given conductance type with conductance-type reversing dope substance and heating the contacted body to diffusion temperature from about 1100° C. to about 1260° C. for a period from about 15 to about 60 minutes to produce in said body a reversely doped surface layer of smaller thickness and higher dope concentration than ultimately required; then etching into the reversely doped layer a groove and thereby dividing the layer into separate zones, the etched groove being given a depth smaller than said ultimate doped layer depth and a width sufficient to maintain zone separation in the ultimate device; and thereafter again heating the body to a temperature from about 1100° C. to about 1260° C. for a period of about one day so as to diffuse the dope substance down to said ultimate depth and ultimate concentration.

References Cited by the Examiner

UNITED STATES PATENTS

| | | | |
|---|---|---|---|
| 2,561,411 | 7/51 | Pfann | 148—1.5 X |
| 2,629,800 | 2/53 | Pearson | 148—33.2 |
| 2,748,041 | 5/56 | Leverenz | 148—33.2 |
| 2,771,382 | 11/56 | Fuller | 148—33.2 |
| 2,802,760 | 8/57 | Derick et al. | 148—1.5 |
| 2,845,374 | 7/58 | Jones | 148—1.5 |
| 2,910,653 | 10/59 | Pritchard | 148—33.2 |
| 2,911,539 | 11/59 | Tanenbaum | 148—33.2 |
| 2,919,388 | 12/59 | Ross | 148—33.2 |

FOREIGN PATENTS 739,294 10/55 Great Britain.

BENJAMIN HENKIN, *Primary Examiner.*

RAY K. WINDHAM, DAVID L. RECK, *Examiners.*